(12) United States Patent
Rooijakkers

(10) Patent No.: US 8,760,625 B2
(45) Date of Patent: Jun. 24, 2014

(54) LITHOGRAPHIC APPARATUS, ABERRATION DETECTOR AND DEVICE MANUFACTURING METHOD

(75) Inventor: Wilhelmus Jacobus Maria Rooijakkers, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 357 days.

(21) Appl. No.: 13/169,666

(22) Filed: Jun. 27, 2011

(65) Prior Publication Data
US 2012/0026477 A1 Feb. 2, 2012

Related U.S. Application Data

(60) Provisional application No. 61/369,349, filed on Jul. 30, 2010.

(51) Int. Cl.
G03B 27/52 (2006.01)
G03F 7/20 (2006.01)
G01M 11/02 (2006.01)

(52) U.S. Cl.
CPC ............ G03F 7/706 (2013.01); G06F 7/70591 (2013.01); G06F 7/7085 (2013.01); G01M 11/0242 (2013.01); G01M 11/0264 (2013.01); G03F 7/70758 (2013.01)
USPC .................. 355/55; 355/53; 355/72; 355/75; 356/124

(58) Field of Classification Search
CPC ... G03F 7/706; G03F 7/70591; G03F 7/7085; G03F 7/70758; G03M 11/0242; G03M 11/0264

USPC .......................... 355/53, 55, 72, 75; 356/124
See application file for complete search history.

(56) References Cited

U.S. PATENT DOCUMENTS

| 2002/0118349 A1* | 8/2002 | Yang et al. ................. 355/55 |
| 2002/0159040 A1* | 10/2002 | Hamatani et al. ............ 355/52 |
| 2004/0090606 A1* | 5/2004 | Ishikawa .................... 355/53 |

OTHER PUBLICATIONS

N. Streibl, Phase imaging by the transport equation of intensity, Optics Communications, vol. 49, Issue 1, Feb. 1, 1984, pp. 6-10.*
F. Roddier, "Wavefront sensing and the irradiance transport equation," Appl. Opt. 29, 1402-1403 (1990).*
Nugent, K.A., "X-ray Image Reconstruction using the Transport of Intensity Equation," Proceedings of the 8th International Conference on X-ray Microscopy, IPAP Conference Series 7, Jul. 26, 2006; pp. 399-402.

* cited by examiner

*Primary Examiner* — Steven H Whitesell Gordon
(74) *Attorney, Agent, or Firm* — Sterne, Kessler, Goldstein & Fox P.L.L.C.

(57) ABSTRACT

An aberration detector for a lithographic apparatus is used. An imaging device captures an image of at least one pinhole feature of a target projected onto the imaging device by the projection system of the lithographic apparatus at two different locations separated in a direction parallel to the optical axis of the projection system. A controller obtains a representation of the aberration of the projection system from the captured images.

15 Claims, 4 Drawing Sheets

LITHOGRAPHIC APPARATUS, ABERRATION DETECTOR AND DEVICE MANUFACTURING METHOD

CROSS REFERENCE TO RELATED APPLICATIONS

This application claims benefit under 35 U.S.C. 119(e) to U.S. Provisional Application No. 61/369,349, filed Jul. 30, 2010, which is incorporated by reference herein in its entirety.

BACKGROUND

1. Field of the Present Invention

The present invention relates to a lithographic apparatus, an aberration detector and a method for manufacturing a device.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system configured to produce EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In order to minimize errors in the image formed on the substrate, it is desirable to measure the phase aberration of the projection system that is used to project the image of the patterning device onto the substrate. Typically, such aberrations are measured using interferometry, for example using systems based on lateral shearing interferometry. However, it has been found that using previously known interferometry systems for EUV radiation systems introduces difficulties. For example, it is typically necessary to divide the beam of radiation. However, providing a beam splitter for a beam of EUV radiation is problematic. In particular, such components may absorb a significant portion of the intensity of the beam of EUV radiation and/or may be difficult to manufacture and/or may be fragile.

SUMMARY

It is desirable to provide an alternative system for measuring the aberration of the projection system that may, in particular, be readily applied to lithography systems using EUV radiation.

According to an aspect of the present invention, there is provided a lithographic apparatus, comprising: a support configured to support a patterning device, a substrate table configured to support a substrate, a projection system configured to project an image of a patterning device supported by the support onto a substrate supported on the substrate table, and an aberration detector configured to measure the aberration of the projection system. The aberration detector comprises: a target supported by the support comprising at least one pinhole feature, an imaging device supported by the substrate table, configured to capture an image of the at least one pinhole feature projected by the projection system, an actuator, configured to move the imaging device in a direction parallel to the optical axis of the projection system, and a controller, configured to use the imaging device to obtain respective images of the at least one pinhole feature projected by the projection system for two different positions of the imaging device in the direction parallel to the optical axis of the projection system and to obtain a representation of the aberration of the projection system from the respective images.

According to an aspect of the present invention, there is provided an aberration detector configured to measure the aberration of a projection system in a lithographic apparatus, comprising: a patterning device comprising at least one pinhole feature, an imaging device, configured to capture an image of the at least one pinhole feature projected by the projection system, an actuator, configured to move the imaging device in a direction parallel to the optical axis of the projection system, and a controller, configured to use the imaging device to obtain respective images of the at least one pinhole feature projected by the projection system for two different positions of the imaging device in the direction parallel to the optical axis of the projection system and to obtain a representation of the aberration of the projection system from the respective images.

According to an aspect of the present invention, there is provided a device manufacturing method, comprising: using a lithographic apparatus to project an image of a patterning device supported by a support onto a substrate supported on a substrate table, and measuring the aberration of the projection system used to project the image into the substrate. The measuring the aberration comprises: providing a patterning device to the support that comprises at least one pinhole feature, using an imaging device supported by the substrate table, to capture a first image of the at least one pinhole feature projected by the projection system, moving the imaging device in a direction parallel to the optical axis of the projection system, using the imaging device to capture a second image of the at least one pinhole feature projected by the projection system after the imaging device has been moved to a different position from that at which the first image was captured, and obtaining a representation of the aberration of the projection system from the first and second images.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
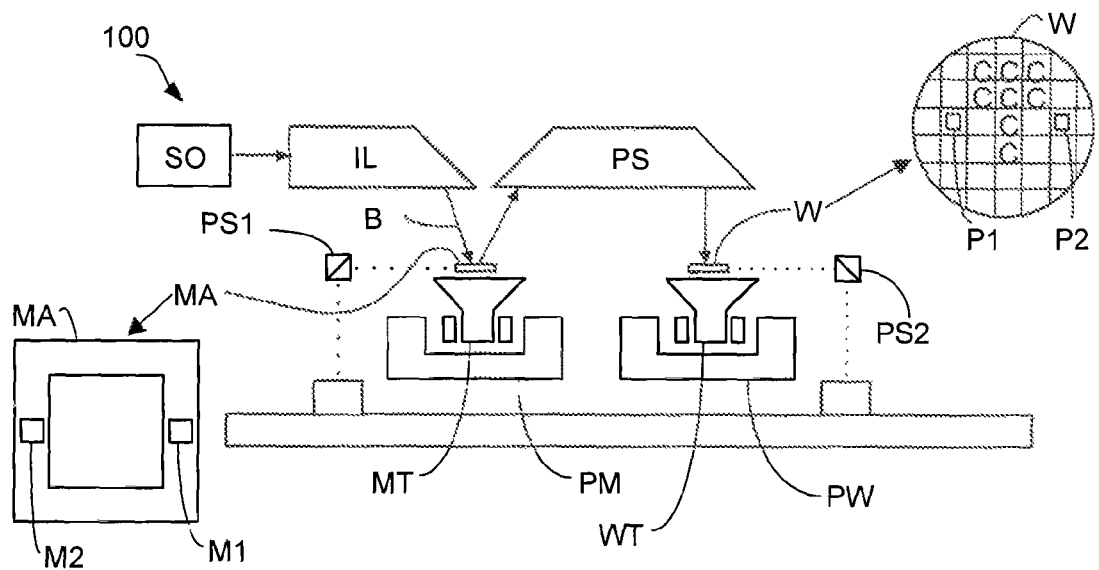
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one of more processors. A machine-readable medium may include any mechanism configured to store or transmit information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus 100 including a source collector module SO according to one embodiment of the present invention. The apparatus comprises an illumination system (illuminator) IL configured to condition a radiation beam B (e.g., EUV radiation), a support structure (e.g., a mask table) MT constructed to support a patterning device (e.g., a mask or a reticle) MA and connected to a first positioner PM configured to accurately position the patterning device, a substrate table (e.g., a wafer table) WT constructed to hold a substrate (e.g., a resist-coated wafer) W and connected to a second positioner PW configured to accurately position the substrate, and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, to provide the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
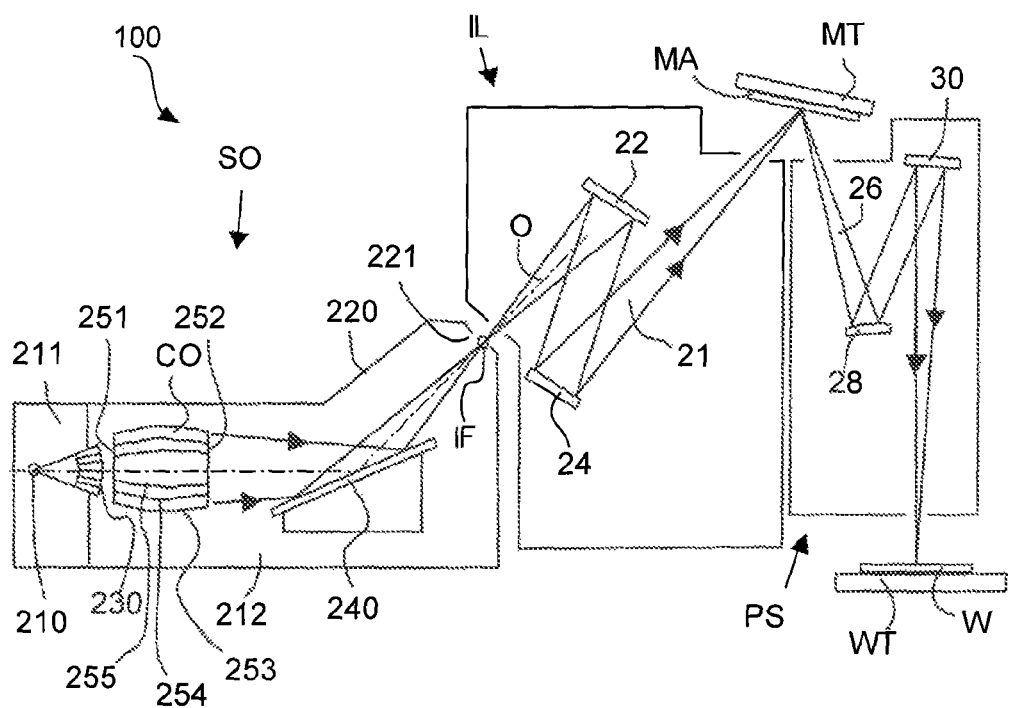
FIG. 2 is a more detailed view of the apparatus in FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
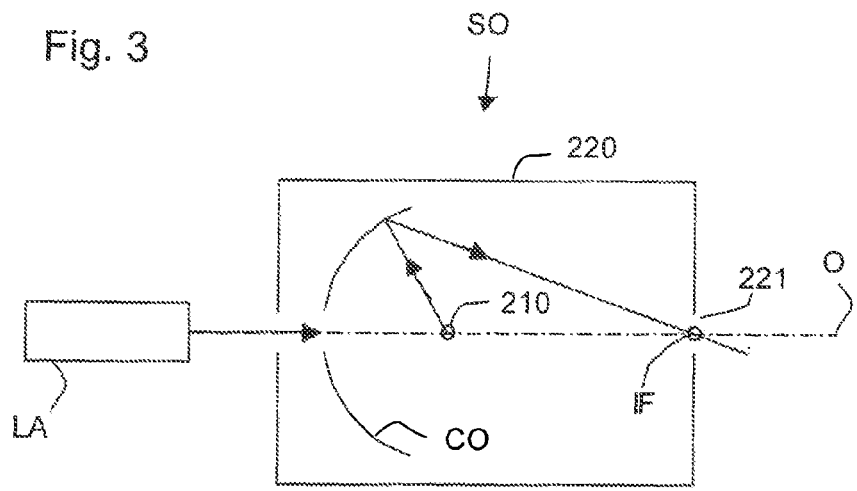
FIG. 3 is a more detailed view of the source collector module SO of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
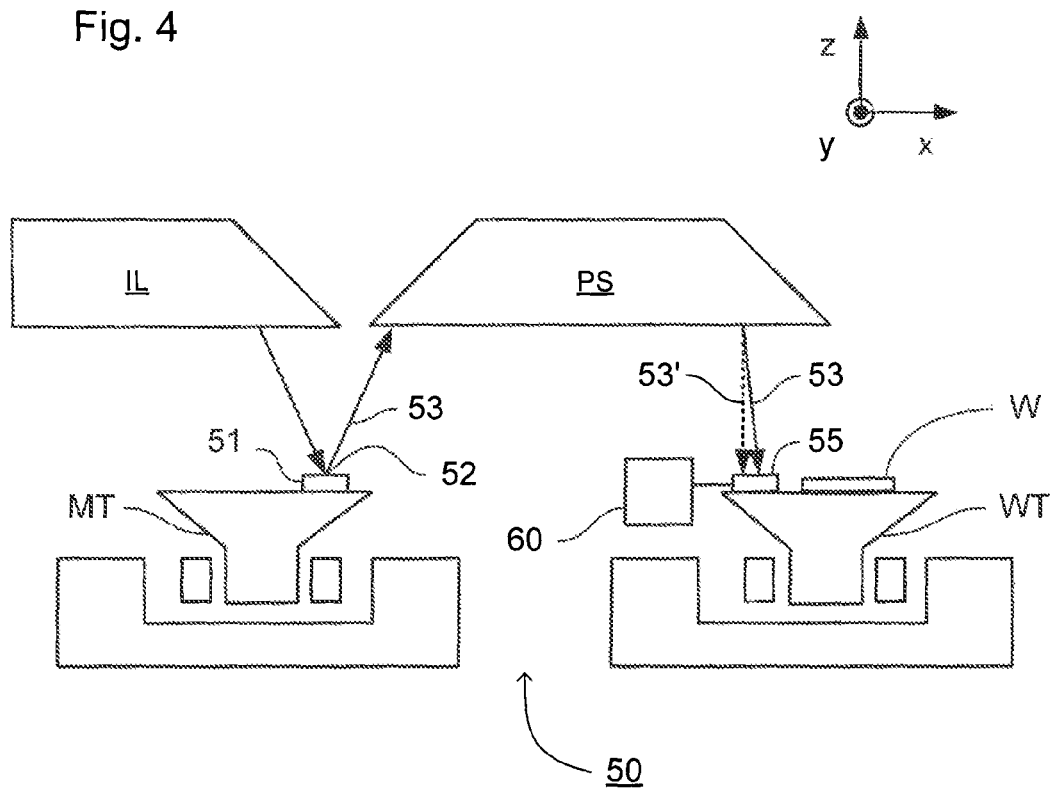
FIG. 4 depicts an arrangement of an aberration detector according to an embodiment of the present invention.

The present invention provides an aberration detector for a lithographic apparatus that is configured to measure the aberration of the projection system PS without using interferometry. FIG. 4 schematically illustrates the principle of operation of the aberration detector 50 of the present invention.

As shown, a target 51 is provided on the support structure MT that supports the patterning device MA during normal operation of the lithographic apparatus 100. The target 51 includes one or more pinhole features 52. Such pinhole features 52 are arranged to transmit a narrow beam of radiation into the projection system PS.

It will be appreciated that in a reflective system, such as that depicted in FIGS. 1 and 4, the pinhole feature 52 may be a small reflective element surrounded by a region that does not reflect the radiation. Such an arrangement may be appropriate for use with EUV radiation. It will further be appreciated, however, that the aberration detector 50 of the present invention may also be used with a lithographic apparatus using other forms of radiation. In that case, a transmissive system may be used, for example one in which the patterning device is transmissive. In this case, the pinhole feature 52 may be a narrow aperture.

Regardless of whether a reflective or a transmissive system is used, the size of the pinhole feature 52 may be selected to be a small as possible. However, it will be appreciated that the size of the pinhole feature must be sufficient that enough radiation passes through for the measurements discussed below to be made. For example, the size of the pinhole feature 52 may be approximately 100 µm.

As shown in FIG. 4, a ray of radiation 53 associated with the pinhole feature 52 of the target 51 is projected by the projection system PS onto an imaging device 55 supported by the substrate table WT. As shown in FIG. 4, if there were no aberrations within the projection system, the ray of radiation would follow a nominal path 53' relative to the optical axis of the projection system. However, due to the aberrations within the projection system PS, the actual ray of radiation 53 deviates slightly from this nominal path 53'. It will be appreciated that the deviation shown in FIG. 4, and the subsequent Figures, is an exaggeration in order to illustrate the principle of the present invention.

In an embodiment, the entrance pupil of the projection system may be fragmented, for example by a pupil facet mirror in the case of an apparatus configured to use EUV radiation. In this case, a corresponding plurality of intensity features may be captured by the imaging device 55 for each pinhole feature 52 of the target 51. Such an arrangement may provide improved aberration sensitivity, namely provide improved signal to noise in the determination of the aberration from the intensity images. However, it should be appreciated that the fragmentation of the pupil is not essential.

In order to measure the aberration of the projection system PS, the aberration detector 50 is configured such that the imaging device 55 may be moved in a direction parallel to the optical axis of the projection system PS. For two different positions of the imaging device 55 in the direction parallel to the optical axis of the projection system PS, images are captured using the imaging device 55. These images may be compared in order to provide a representation of the aberration of the projection system PS, as discussed below. It should be appreciated that, although movement in a direction parallel to the optical axis is required, it is not precluded that the imaging device may also be moved in another direction, for example within a plane perpendicular to the optical axis of the projection system PS. In this case, the aberration detector 50 may be configured to take into account the movement in any direction other than parallel to the optical axis of the projection system.

Figure 5:
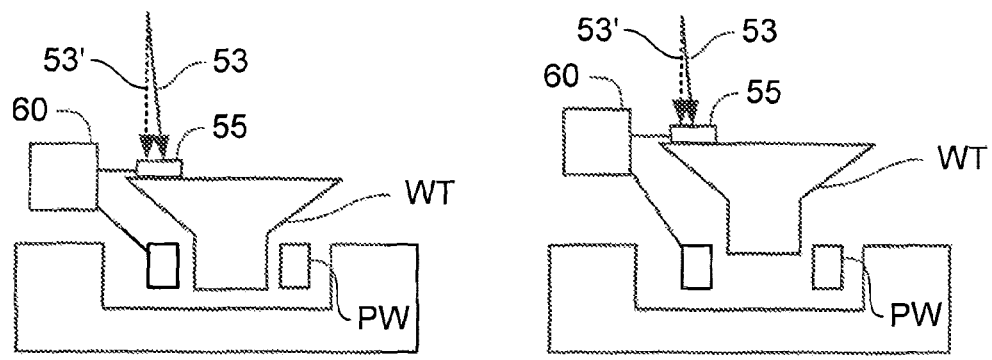
FIG. 5 depicts a portion of an aberration detector according to an embodiment of the present invention in two different positions.
Figure 6:
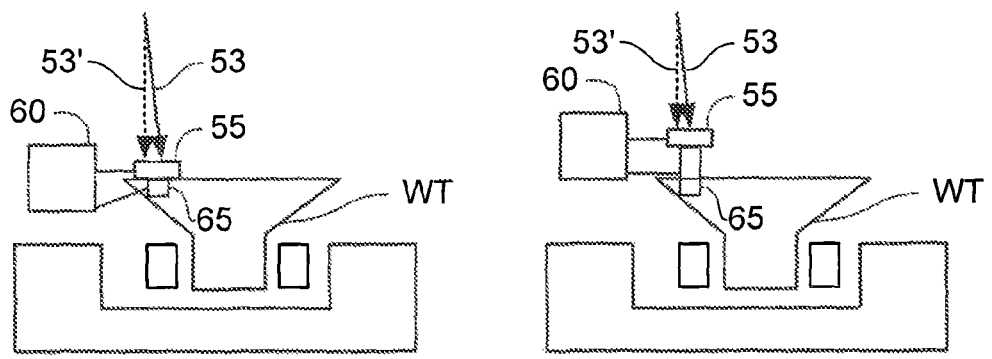
FIG. 6 depicts a portion of an alternative aberration detector according to an embodiment of the present invention in different two positions.

As illustrated in FIGS. 5 and 6, which each illustrate the imaging device 55 being provided in two different positions at which images are captured, the imaging device 55 may be mounted on the substrate table WT. In particular, the imaging device 55 may be mounted on the upper surface of the substrate table WT, for example adjacent a region in which the substrate table WT may support a substrate. Accordingly, the imaging device 55 may be moved to a position for capturing images of the target 51 projected onto the imaging device 55 by the projection system PS by movement of the substrate table WT in a direction parallel to the upper surface of the substrate table WT by means of the positioner PW that is provided for movement of the substrate table WT.

Such a positioning system PW for the substrate table WT may also be configured to adjust the position of the substrate table WT, and therefore a substrate W supported on the substrate table WT, in a direction perpendicular to the upper surface of the substrate table WT, namely parallel to the optical axis of the projection system PS. Such positioning control may be provided, for example, in order to effect focal plane adjustments.

In one embodiment, as depicted in FIG. 5, the range of movement of the substrate table WT in the direction parallel to the optical axis of the projection system PS may also be used for the aberration detector 50.

In particular, the aberration detector 50 may include a controller 60 that uses the positioner PW to move the substrate table WT, and the imaging device 55 mounted to the upper surface of the substrate table WT, between two positions differing in at least the direction parallel to the optical axis of the projection system PS.

The controller 60 may further control the imaging device 55 in order to capture respective images of the target 51 at the different positions, such as those depicted in FIG. 5.

It will be appreciated that the two positions may be selected in order to optimize the operation of the aberration detector. In one example, the two positions may be selected to be the extreme positions attainable by the positioner PW along the direction of movement that is parallel to the optical axis of the projection system PS. Such positions may maximize the separation of the two positions at which images are captured. This may in turn maximize the difference between the two captured images caused by the aberration. As will be appreciated, this may maximize the accuracy of the measurement of the aberration.

In an embodiment, the separation of the two positions in the direction parallel to the optical axis of the projection system PS may be 1 mm.

It will be appreciated that such embodiments, in which the movement of the imaging device 55 in the direction parallel to the optical axis of the projection system is provided by the positioner PW of the substrate table WT advantageously does not require any additional actuator systems and associated control systems. Furthermore, the position of the substrate table WT may be accurately determined using systems that are provided for control of the movement of the substrate table WT during the lithography process. Accordingly, additional sensors in order to measure the movement of the imaging device 55 between the two positions at which images are captured are not required.

In an embodiment, it may be considered that the range of movement of the imaging device 55 attained by the positioner PW of the substrate table WT, namely the range of movement of the substrate table WT in the direction parallel to the optical axis of the projection system PS, may be insufficient. Accordingly, alternatively or additionally to adjusting the position of the imaging device 55 using the positioner PW of the substrate table WT, an actuator system 65 may be provided and configured to control the position of the imaging device 55 relative to the position of the substrate table WT in at least the direction parallel to the optical axis of the projection system PS.

In such an embodiment, as depicted in the two images depicted in FIG. 6, the imaging device 55 may be moved relative to the substrate table WT, in at least the direction parallel to the optical axis of the projection system PS, between at least two different positions. At each of these positions, images may be captured by the imaging device 55 in order to obtain a representation of the aberration of the projection system.

It will be appreciated that the actuator system 65 configured to control the position of the image device 55 relative to the substrate table WT may also be controlled by the controller 60 of the aberration detector. A position measurement system may also be provided in order to measure accurately the position of the imaging device 55 relative to the substrate table WT in order that an accurate determination of the position of the imaging device 55 may be made at the locations at which images of the target 51 are captured.

It will further be appreciated that an arrangement such as that depicted in FIG. 6, in which an actuator system 65 is provided for controlling the position of the imaging device 55 relative to the substrate table WT may advantageously permit greater separations between the positions of the imaging device 55 at which images of the target 51 are captured than would be attainable using movement of the substrate table WT alone. This may improve the accuracy of measurement of the aberration of the projection system PS.

It will be appreciated that although the present invention has been discussed above in relation to the capturing of images of a pinhole feature 52 at two positions of the imaging device 55, the target 51 may include a plurality of pinhole features 52 spread across the illumination field. Accordingly, the captured images of the target 51 may include corresponding images of each of the pinhole features 52. Analysis of respective images of each pinhole feature 52 in the different captured images provides data concerning the aberration of the projection system PS for each part of the illumination field.

In order to obtain a representation of the aberration of the projection system PS from the images obtained from the imaging device 55 at the respective different positions, the captured images of the target 51 may be processed, for example by the controller 60, to generate pupil images that do not include the magnification effects or geometrical effects that are introduced by the projection system. For example, the coordinate system of the image may be transformed from a coordinate system associated with the imaging device 55 to a suitable coordinate system to obtain a representation of the aberration of the projection system as described below. The resulting processed pupil images may then be used to obtain the representation of the aberration of the projection system PS.

For example, the representation of the aberration of the projection system may be obtained by determining the wave front phase Φ(x,y,z) from the transport of intensity equation (TIE):

$$\frac{2\pi}{\lambda}\frac{\partial I(x, y)}{\partial z} = \nabla \cdot [I(x, y, z)\nabla \Phi(x, y, z)]$$

from the intensity images I(x, y, z) and I(x, y, z+dz) captured using the imaging device 55 at the different positions of the imaging device 55 in the direction parallel to the optical axis of the projection system PS.

This may be performed using any convenient known mathematical technique, for example such as is explained in Proc. $8^{th}$ Int. Conf. X-ray Microscopy, IPAP Conf. Series 7, pp 399-402, K. A. Nugent, which is hereby incorporated by reference in its entirety.

In an alternative arrangement, a simplified technique may provide a first order approximation of the aberration of the projection system for example for apparatus in which the pupil is fragmented. In this case, the centre locations of each intensity feature each of the processed pupil images are determined. The displacement of the intensity feature in comparing the processed pupil images for the two different positions of the imaging device 55 is proportional to the localized phase gradient. Accordingly, the values for each intensity feature may be assigned to an associated region of the illumination field and stitched together in order to provide an approximation of the aberration of the projection system PS.

It will be appreciated that the controller 60 may be configured to provide the representation of the aberration of the projection system in the form of Zernike coefficients. This may facilitate the use of the representation of the aberration of the projection system PS in improving the operation of the lithographic apparatus. For example, the data of the representation of the aberration of the projection system maybe used in order to adjust one or more settings of the lithographic apparatus in order to ensure that the quality of the image formed by the lithographic apparatus is as high as possible. It will, accordingly, be appreciated that the aberration detector 50 of the present invention may be utilized during the set-up of the lithographic apparatus.

Furthermore, the aberration detector 50 may be used between processing of batches of substrates W by the lithographic apparatus. Accordingly, the aberration detector 50 of the present invention may be used to monitor any variations in the aberration of the projection system PS, for example caused by any small temperature variations, and appropriate adjustments to the operation of the lithographic apparatus may be made.

For example, heating of lenses may have a significant impact on Zernike terms Z5 and Z12 (astigmatism terms). In particular, if dipole illumination modes are used, two regions of a lens element may be illuminated, and therefore heated, while the remainder is not. This may result in a dent in the phase wavefront at these specific regions. Compensation for such aberrations may be provided by displacing lens or mirror elements or by locally heating, displacing or exerting force on the lens or mirror elements.

Figure 7:
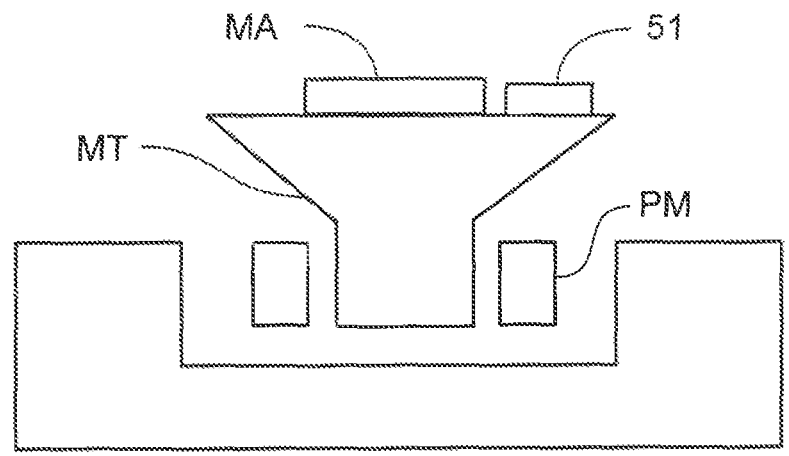
FIG. 7 depicts an arrangement of a further portion of an aberration detector according to an embodiment of the present invention.

As depicted in FIG. 7, the target 51 comprising at least one pinhole feature 52 may be mounted to the support MT in the lithographic apparatus configured to support a patterning device MA at a location adjacent the region in which the patterning device MA is supported on the support MT during normal use of the lithography apparatus, namely in which an image of the patterning device MA is projected onto a substrate. Accordingly, in order to operate the aberration detector 50 of the present invention, the support MT may be moved by its associated positioner PM such that the target 51 is illuminated by the illumination system IL. For example, this may occur at the same time that the substrate table WT is moved by its associated positioner PW such that the imaging device 55 is located to capture an image of the target 51. Accordingly a lithographic apparatus arranged in this manner may be switched rapidly from a first mode, in which images of patterning devices MA are projected onto substrate W, to a second mode, in which the aberration detector 50 of the present invention may be used.

Figure 8:
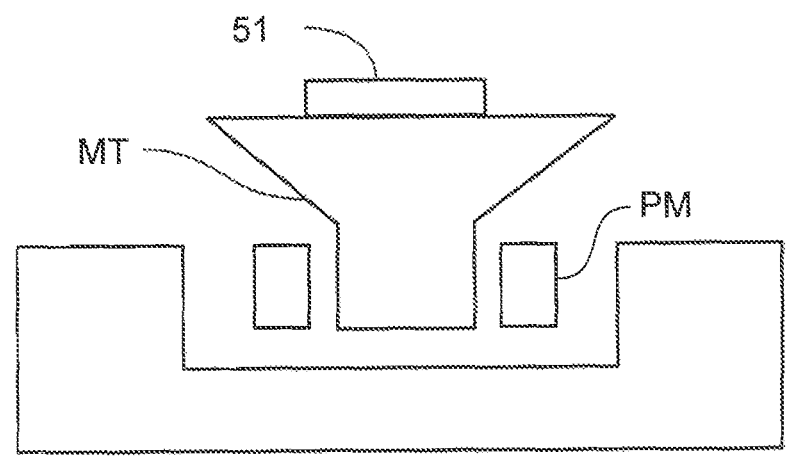
FIG. 8 depicts an alternative of the further portion of an aberration detector according to an embodiment of the present invention.

In an alternative arrangement, as depicted in FIG. 8, the target 51 may be provided in the form of a patterning device that may be supported on the support MT in place of a patterning device MA used for forming images on substrates W to form devices. Such an arrangement may have an advantage over the arrangement depicted in FIG. 7 in that the target 51 may be larger. This may permit the illumination of pinhole features 52 across the illumination field simultaneously. Accordingly, operation of the aberration detector in order to obtain a representation of the aberration of the projection system may be faster.

Advantageously, because the aberration detector 50 of the present invention may easily be incorporated within the lithographic apparatus and may be relatively quickly operated by capturing two intensity images using an imaging device, the time taken to determine the aberration of the projection system PS may be relatively short. Accordingly down-time of the lithographic apparatus may be kept to a minimum.

Although the present invention has been discussed above in respect of an example in which the representation of the aberration of the projection system PS is determined from two images, respectively captured by the imaging device 55 at two different positions, it should be appreciated that the present invention is not limited to such an arrangement. In particular, additional images of the target 51 may be captured at further positions and the data from all of the images used to determine the representation of the aberration of the projection system PS. This may improve the accuracy of the measured aberration.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus, comprising:
   a support configured to support a patterning device;
   a substrate table configured to support a substrate;
   a projection system configured to project an image of a patterning device supported by the support onto a substrate supported on the substrate table; and
   an aberration detector configured to measure an aberration of the projection system, wherein the aberration detector comprises:
      a target supported by the support comprising a pinhole feature;
      an imaging device supported by the substrate table, configured to capture an image of the pinhole feature projected by the projection system;
      an actuator, configured to move the imaging device in a direction parallel to the optical axis of the projection system between a first position and a second position; and
      a controller configured to obtain respective images of the pinhole feature projected by the projection system from the imaging device in the first position and the second position and to obtain a representation of the aberration of the projection system from the respective images.

2. The lithographic apparatus according to claim 1, wherein the controller is configured to process the images captured by the imaging device to generate pupil images that do not include the magnification effects or the geometrical effects introduced by the projection system.

3. The lithographic apparatus according to claim 2, wherein the processed pupil images are used to obtain the representation of the aberration of the projection system.

4. The lithographic apparatus according to claim 1, wherein the controller is configured to obtain the representation of the aberration of the projection system by estimating a localized phase gradient from a difference in the location of the center of corresponding images of each pinhole feature in the respective images for the two different positions of the imaging device in the direction parallel to the optical axis of the projection system.

5. The lithographic apparatus according to claim 1, wherein the controller is configured to determine the representation of the aberration of the projection system in the form of Zernike coefficients.

6. The lithographic apparatus according to claim 1, wherein the target of the aberration detector includes a plurality of pinhole features across the illumination field.

7. The lithographic apparatus according to claim 1, wherein:
   the imaging device is fixed to the substrate table; and
   the actuator for moving the imaging device in the direction parallel to the optical axis of the projection system is configured to adjust the position of the substrate table in the direction.

8. The lithographic apparatus according to claim 1, wherein the actuator for moving the imaging device in the direction parallel to the optical axis of the projection system is configured to move the imaging device relative to the substrate table in the direction.

9. The lithographic apparatus according to claim 1, wherein the controller is configured to use the imaging device and the actuator to obtain respective images of the pinhole feature projected by the projection system for more than two different positions of the imaging device in the direction parallel to the optical axis of the projection system and to use the images to obtain the representation of the aberration of the projection system.

10. The lithographic apparatus according to claim 1, wherein the target comprising the pinhole feature is mounted to the support adjacent an area in which a patterning device is supported during operation of the lithographic apparatus to project an image of the patterning device onto a substrate.

11. The lithographic apparatus according to claim 1, wherein the target comprising the pinhole feature is a patterning device that, during operation of the aberration detector, is supported on the support in an area configured to support a patterning device during operation of the lithography apparatus to project an image of the patterning device onto a substrate.

12. The lithographic apparatus according to claim 1, further comprising a pupil facet mirror configured to fragment the entrance pupil of the projection system.

13. An aberration detector, comprising:
a patterning device comprising a pinhole feature;
an imaging device, configured to capture an image of the pinhole feature projected by a projection system;
an actuator, configured to move the imaging device in a direction parallel to the optical axis of the projection system between a first position and a second position; and
a controller configured to obtain respective images of the pinhole feature projected by the projection system from the imaging device in the first position and the second position and to obtain a representation of the aberration of the projection system from the respective images.

14. A method, comprising:
projecting, by a projection system of a lithographic apparatus, an image of a patterning device supported by a support onto a substrate supported on a substrate table, the patterning device comprising a pinhole feature; and
capturing, by an imaging device, a first image of the pinhole feature projected by the projection system;
moving the imaging device in a direction parallel to the optical axis of the projection system;
capturing, by the imaging device, a second image of the pinhole feature projected by the projection system after the imaging device has been moved to a different position from that at which the first image was captured; and
obtaining a representation of an aberration of the projection system from the first and second images.

15. The method according to claim 14, wherein at least one setting of the lithographic apparatus is controlled using data of the representation of the aberration of the projection system.

* * * * *